(12) United States Patent
Shalvi

(10) Patent No.: US 7,751,240 B2
(45) Date of Patent: Jul. 6, 2010

(54) MEMORY DEVICE WITH NEGATIVE THRESHOLDS

(75) Inventor: Ofir Shalvi, Ra'anana (IL)

(73) Assignee: Anobit Technologies Ltd., Herzeliya Pituach ( * ) Notice: Subject to any disclaimer, the term of this patent is extended or adjusted under 35 U.S.C. 154(b) by 131 days.

(21) Appl. No.: 12/019,011

(22) Filed: Jan. 24, 2008

(65) Prior Publication Data
US 2008/0181001 A1 Jul. 31, 2008

Related U.S. Application Data

(60) Provisional application No. 60/886,429, filed on Jan. 24, 2007.

(51) Int. Cl.
*G11C 16/04* (2006.01)
(52) U.S. Cl. .............................. 365/185.03; 365/185.23
(58) Field of Classification Search ............ 365/185.03, 365/185.23, 185.24, 185.33
See application file for complete search history.

(56) References Cited

U.S. PATENT DOCUMENTS

| | | | |
|---|---|---|---|
| 4,556,961 A | 12/1985 | Iwahashi et al. | |
| 4,558,431 A | 12/1985 | Satoh | |
| 4,661,929 A | 4/1987 | Aoki et al. | |
| 4,768,171 A | 8/1988 | Tada | |
| 4,811,285 A | 3/1989 | Walker et al. | |
| 4,899,342 A | 2/1990 | Potter et al. | |
| 4,910,706 A | 3/1990 | Hyatt | |
| 4,993,029 A | 2/1991 | Galbraith et al. | |
| 5,056,089 A | 10/1991 | Furuta et al. | |
| 5,077,722 A | 12/1991 | Geist et al. | |
| 5,172,338 A | 12/1992 | Mehrotta et al. | |
| 5,191,584 A | 3/1993 | Anderson | |
| 5,200,959 A | 4/1993 | Gross et al. | |
| 5,237,535 A | 8/1993 | Mielke et al. | |
| 5,272,669 A | 12/1993 | Samachisa et al. | |

(Continued)

FOREIGN PATENT DOCUMENTS

EP 0783754 B1 7/1997

(Continued)

OTHER PUBLICATIONS

Agrell et al., "Closest Point Search in Lattices", IEEE Transactions on Information Theory, vol. 48, No. 8, pp. 2201-2214, Aug. 2002.

(Continued)

*Primary Examiner*—Vu A Le
(74) *Attorney, Agent, or Firm*—Fish & Richardson P.C.

(57) ABSTRACT

A method for data storage in a memory that includes a plurality of analog memory cells includes storing data in the memory by writing first storage values to the cells. One or more read reference levels are defined for reading the cells, such that at least one of the read reference levels is negative. After storing the data, second storage values are read from the cells using the read reference levels, so as to reconstruct the stored data. In another disclosed method, data is stored in the memory by mapping the data to first storage values selected from a set of the nominal storage values, and writing the first storage values to the cells. The set of nominal storage values is defined such that at least one of the nominal storage values is negative.

19 Claims, 3 Drawing Sheets

U.S. PATENT DOCUMENTS

| | | | |
|---|---|---|---|
| 5,276,649 A | 1/1994 | Hoshita et al. | |
| 5,388,064 A | 2/1995 | Khan | |
| 5,416,646 A | 5/1995 | Shirai | |
| 5,473,753 A | 12/1995 | Wells et al. | |
| 5,479,170 A | 12/1995 | Cauwenberghs et al. | |
| 5,508,958 A | 4/1996 | Fazio et al. | |
| 5,519,831 A | 5/1996 | Holzhammer | |
| 5,541,886 A | 7/1996 | Hasbun | |
| 5,600,677 A | 2/1997 | Citta et al. | |
| 5,657,332 A | 8/1997 | Auclair et al. | |
| 5,675,540 A | 10/1997 | Roohparvar | |
| 5,696,717 A | 12/1997 | Koh et al. | |
| 5,726,649 A | 3/1998 | Tamaru et al. | |
| 5,742,752 A | 4/1998 | De Koning | |
| 5,751,637 A | 5/1998 | Chen et al. | |
| 5,761,402 A | 6/1998 | Kaneda et al. | |
| 5,801,985 A | 9/1998 | Roohparvar et al. | |
| 5,838,832 A | 11/1998 | Barnsley | |
| 5,860,106 A | 1/1999 | Domen et al. | |
| 5,867,429 A | 2/1999 | Chen et al. | |
| 5,877,986 A | 3/1999 | Harari et al. | |
| 5,901,089 A | 5/1999 | Korsh et al. | |
| 5,909,449 A | 6/1999 | So et al. | |
| 5,912,906 A | 6/1999 | Wu et al. | |
| 5,930,167 A | 7/1999 | Lee et al. | |
| 5,942,004 A | 8/1999 | Cappelletti | |
| 5,991,517 A | 11/1999 | Harari et al. | |
| 6,009,014 A | 12/1999 | Hollmer et al. | |
| 6,034,891 A | 3/2000 | Norman | |
| 6,040,993 A | 3/2000 | Chen et al. | |
| 6,041,430 A | 3/2000 | Yamauchi | |
| 6,073,204 A | 6/2000 | Lakhani et al. | |
| 6,101,614 A | 8/2000 | Gonzales et al. | |
| 6,128,237 A | 10/2000 | Shirley et al. | |
| 6,134,140 A | 10/2000 | Tanaka et al. | |
| 6,134,143 A | 10/2000 | Norman | |
| 6,134,631 A | 10/2000 | Jennings | |
| 6,141,261 A | 10/2000 | Patti | |
| 6,166,962 A | 12/2000 | Chen et al. | |
| 6,185,134 B1 | 2/2001 | Tanaka et al. | |
| 6,209,113 B1 | 3/2001 | Roohparvar | |
| 6,212,654 B1 | 4/2001 | Lou et al. | |
| 6,219,276 B1 | 4/2001 | Parker | |
| 6,219,447 B1 | 4/2001 | Lee et al. | |
| 6,222,762 B1 | 4/2001 | Guterman et al. | |
| 6,230,233 B1 | 5/2001 | Lofgren et al. | |
| 6,275,419 B1 | 8/2001 | Guterman et al. | |
| 6,279,069 B1 | 8/2001 | Robinson et al. | |
| 6,288,944 B1 | 9/2001 | Kawamura et al. | |
| 6,292,394 B1 | 9/2001 | Cohen et al. | |
| 6,301,151 B1 | 10/2001 | Engh et al. | |
| 6,304,486 B1 | 10/2001 | Yano | |
| 6,307,776 B1 | 10/2001 | So et al. | |
| 6,317,363 B1 | 11/2001 | Guterman et al. | |
| 6,317,364 B1 | 11/2001 | Guterman et al. | |
| 6,363,008 B1 | 3/2002 | Wong | |
| 6,363,454 B1 | 3/2002 | Lakhani et al. | |
| 6,396,742 B1 | 5/2002 | Korsh et al. | |
| 6,397,364 B1 | 5/2002 | Barkan | |
| 6,405,323 B1 | 6/2002 | Lin et al. | |
| 6,442,585 B1 | 8/2002 | Dean et al. | |
| 6,456,528 B1 | 9/2002 | Chen | |
| 6,466,476 B1 | 10/2002 | Wong et al. | |
| 6,467,062 B1 | 10/2002 | Barkan | |
| 6,469,931 B1 | 10/2002 | Ban et al. | |
| 6,522,580 B2 * | 2/2003 | Chen et al. | 365/185.02 |
| 6,525,952 B2 | 2/2003 | Araki et al. | |
| 6,532,556 B1 | 3/2003 | Wong et al. | |
| 6,538,922 B1 | 3/2003 | Khalid et al. | |
| 6,558,967 B1 | 5/2003 | Wong | |
| 6,560,152 B1 | 5/2003 | Cernea | |
| 6,577,539 B2 | 6/2003 | Iwahashi | |
| 6,584,012 B2 | 6/2003 | Banks | |
| 6,615,307 B1 | 9/2003 | Roohparvar | |
| 6,621,739 B2 | 9/2003 | Gonzales et al. | |
| 6,643,169 B2 | 11/2003 | Rudelic et al. | |
| 6,678,192 B2 | 1/2004 | Gongwer et al. | |
| 6,687,155 B2 | 2/2004 | Nagasue | |
| 6,707,748 B2 | 3/2004 | Lin et al. | |
| 6,708,257 B2 | 3/2004 | Bao | |
| 6,717,847 B2 | 4/2004 | Chen | |
| 6,731,557 B2 | 5/2004 | Beretta | |
| 6,738,293 B1 | 5/2004 | Iwahashi | |
| 6,751,766 B2 | 6/2004 | Guterman et al. | |
| 6,757,193 B2 | 6/2004 | Chen et al. | |
| 6,774,808 B1 | 8/2004 | Hibbs et al. | |
| 6,781,877 B2 | 8/2004 | Cernea et al. | |
| 6,807,095 B2 | 10/2004 | Chen et al. | |
| 6,829,167 B2 | 12/2004 | Tu et al. | |
| 6,845,052 B1 | 1/2005 | Ho et al. | |
| 6,851,018 B2 | 2/2005 | Wyatt et al. | |
| 6,856,546 B2 | 2/2005 | Guterman et al. | |
| 6,862,218 B2 | 3/2005 | Guterman et al. | |
| 6,870,767 B2 | 3/2005 | Rudelic et al. | |
| 6,894,926 B2 | 5/2005 | Guterman et al. | |
| 6,907,497 B2 | 6/2005 | Hosono et al. | |
| 6,963,505 B2 | 11/2005 | Cohen | |
| 6,972,993 B2 | 12/2005 | Conley et al. | |
| 6,988,175 B2 | 1/2006 | Lasser | |
| 6,992,932 B2 | 1/2006 | Cohen | |
| 7,002,843 B2 | 2/2006 | Guterman et al. | |
| 7,012,835 B2 | 3/2006 | Gonzalez et al. | |
| 7,020,017 B2 | 3/2006 | Chen et al. | |
| 7,023,735 B2 | 4/2006 | Ban et al. | |
| 7,031,210 B2 | 4/2006 | Park et al. | |
| 7,031,214 B2 | 4/2006 | Tran | |
| 7,031,216 B2 | 4/2006 | You | |
| 7,054,193 B1 | 5/2006 | Wong | |
| 7,057,958 B2 | 6/2006 | So et al. | |
| 7,065,147 B2 | 6/2006 | Ophir et al. | |
| 7,068,539 B2 | 6/2006 | Guterman et al. | |
| 7,079,555 B2 | 7/2006 | Baydar et al. | |
| 7,088,615 B2 | 8/2006 | Guterman et al. | |
| 7,099,194 B2 | 8/2006 | Tu et al. | |
| 7,102,924 B2 | 9/2006 | Chen et al. | |
| 7,113,432 B2 | 9/2006 | Mokhlesi | |
| 7,130,210 B2 | 10/2006 | Bathul et al. | |
| 7,139,192 B1 | 11/2006 | Wong | |
| 7,139,198 B2 | 11/2006 | Guterman et al. | |
| 7,170,802 B2 | 1/2007 | Cernea et al. | |
| 7,173,859 B2 | 2/2007 | Hemink | |
| 7,177,184 B2 | 2/2007 | Chen | |
| 7,177,195 B2 | 2/2007 | Gonzales et al. | |
| 7,177,199 B2 | 2/2007 | Chen et al. | |
| 7,177,200 B2 | 2/2007 | Ronen et al. | |
| 7,187,195 B2 | 3/2007 | Kim | |
| 7,187,592 B2 | 3/2007 | Guterman et al. | |
| 7,193,898 B2 | 3/2007 | Cernea | |
| 7,193,921 B2 | 3/2007 | Choi et al. | |
| 7,196,928 B2 | 3/2007 | Chen | |
| 7,197,594 B2 | 3/2007 | Raz et al. | |
| 7,200,062 B2 | 4/2007 | Kinsely et al. | |
| 7,221,592 B2 | 5/2007 | Nazarian | |
| 7,224,613 B2 | 5/2007 | Chen et al. | |
| 7,231,474 B1 | 6/2007 | Helms et al. | |
| 7,243,275 B2 | 7/2007 | Gongwer et al. | |
| 7,254,690 B2 | 8/2007 | Rao | |
| 7,257,027 B2 | 8/2007 | Park | |
| 7,259,987 B2 | 8/2007 | Chen et al. | |
| 7,266,026 B2 | 9/2007 | Gongwer et al. | |
| 7,274,611 B2 | 9/2007 | Roohparvar | |
| 7,277,355 B2 | 10/2007 | Tanzana | |
| 7,280,398 B1 | 10/2007 | Lee et al. | |
| 7,289,344 B2 | 10/2007 | Chen | |

| | | | | | | |
|---|---|---|---|---|---|---|
| 7,301,807 B2 | 11/2007 | Khalid et al. | | 2007/0033581 A1 | 2/2007 | Tomlin et al. |
| 7,308,525 B2 | 12/2007 | Lasser et al. | | 2007/0047314 A1 | 3/2007 | Goda et al. |
| 7,310,255 B2 | 12/2007 | Chan | | 2007/0047326 A1 | 3/2007 | Nguyen et al. |
| 7,310,272 B1 | 12/2007 | Mokhlesi et al. | | 2007/0050536 A1 | 3/2007 | Kolokowsky |
| 7,321,509 B2 | 1/2008 | Chen et al. | | 2007/0058446 A1 | 3/2007 | Hwang et al. |
| 7,342,831 B2 | 3/2008 | Mokhlesi et al. | | 2007/0061502 A1 | 3/2007 | Lasser et al. |
| 7,345,928 B2 | 3/2008 | Li | | 2007/0067667 A1 | 3/2007 | Ikeuchi et al. |
| 7,349,263 B2 | 3/2008 | Kim et al. | | 2007/0074093 A1 | 3/2007 | Lasser |
| 7,356,755 B2 | 4/2008 | Fackenthal | | 2007/0086239 A1 | 4/2007 | Litsyn et al. |
| 7,363,420 B2 | 4/2008 | Lin et al. | | 2007/0086260 A1 | 4/2007 | Sinclair |
| 7,397,697 B2 | 7/2008 | So et al. | | 2007/0089034 A1 | 4/2007 | Litsyn et al. |
| 7,408,804 B2 | 8/2008 | Hemink et al. | | 2007/0091677 A1 | 4/2007 | Lasser et al. |
| 7,409,473 B2 | 8/2008 | Conley et al. | | 2007/0091694 A1 | 4/2007 | Lee et al. |
| 7,420,847 B2 | 9/2008 | Li | | 2007/0103978 A1 | 5/2007 | Conley et al. |
| 7,433,231 B2 | 10/2008 | Aritome | | 2007/0103986 A1 | 5/2007 | Chen |
| 7,437,498 B2 | 10/2008 | Ronen | | 2007/0109845 A1 | 5/2007 | Chen |
| 7,441,067 B2 | 10/2008 | Gorobetz et al. | | 2007/0109849 A1 | 5/2007 | Chen |
| 7,453,737 B2 | 11/2008 | Ha | | 2007/0118713 A1 | 5/2007 | Guterman et al. |
| 7,468,911 B2 | 12/2008 | Lutze et al. | | 2007/0143378 A1 | 6/2007 | Gorobetz |
| 7,471,581 B2 | 12/2008 | Tran et al. | | 2007/0143531 A1 | 6/2007 | Atri |
| 7,508,710 B2 | 3/2009 | Mokhlesi | | 2007/0159889 A1 | 7/2007 | Kang et al. |
| 7,570,520 B2 | 8/2009 | Kamei et al. | | 2007/0159892 A1 | 7/2007 | Kang et al. |
| 7,593,259 B2 * | 9/2009 | Kim ........................ 365/185.03 | | 2007/0159907 A1 | 7/2007 | Kwak |
| 7,633,802 B2 | 12/2009 | Mokhlesi | | 2007/0168837 A1 | 7/2007 | Murin |
| 2001/0006479 A1 | 7/2001 | Ikehashi et al. | | 2007/0171714 A1 | 7/2007 | Wu et al. |
| 2002/0118574 A1 | 8/2002 | Gongwer et al. | | 2007/0183210 A1 | 8/2007 | Choi et al. |
| 2002/0174295 A1 | 11/2002 | Ulrich et al. | | 2007/0189073 A1 | 8/2007 | Aritome |
| 2002/0196510 A1 | 12/2002 | Hietala et al. | | 2007/0206426 A1 | 9/2007 | Mokhlesi |
| 2003/0002348 A1 | 1/2003 | Chen et al. | | 2007/0208904 A1 | 9/2007 | Hsieh et al. |
| 2003/0103400 A1 | 6/2003 | Van Tran | | 2007/0226599 A1 | 9/2007 | Motwani |
| 2003/0161183 A1 | 8/2003 | Tran | | 2007/0236990 A1 | 10/2007 | Aritome |
| 2003/0189856 A1 | 10/2003 | Cho et al. | | 2007/0253249 A1 | 11/2007 | Kang et al. |
| 2004/0057265 A1 | 3/2004 | Mirabel et al. | | 2007/0256620 A1 | 11/2007 | Viggiano et al. |
| 2004/0057285 A1 | 3/2004 | Cernea et al. | | 2007/0266232 A1 | 11/2007 | Rodgers et al. |
| 2004/0083333 A1 | 4/2004 | Chang et al. | | 2007/0271424 A1 | 11/2007 | Lee et al. |
| 2004/0083334 A1 | 4/2004 | Chang et al. | | 2007/0280000 A1 | 12/2007 | Fujiu et al. |
| 2004/0105311 A1 | 6/2004 | Cernea et al. | | 2008/0010395 A1 | 1/2008 | Mylly et al. |
| 2004/0114437 A1 | 6/2004 | Li | | 2008/0025121 A1 | 1/2008 | Tanzawa |
| 2004/0160842 A1 | 8/2004 | Fukiage | | 2008/0043535 A1 | 2/2008 | Roohparvar |
| 2005/0007802 A1 | 1/2005 | Gerpheide | | 2008/0049504 A1 | 2/2008 | Kasahara et al. |
| 2005/0013165 A1 | 1/2005 | Ban | | 2008/0049506 A1 | 2/2008 | Guterman |
| 2005/0024941 A1 | 2/2005 | Lasser et al. | | 2008/0055993 A1 | 3/2008 | Lee |
| 2005/0024978 A1 | 2/2005 | Ronen | | 2008/0080243 A1 | 4/2008 | Edahiro et al. |
| 2005/0086574 A1 | 4/2005 | Fackenthal | | 2008/0082730 A1 | 4/2008 | Kim et al. |
| 2005/0121436 A1 | 6/2005 | Kamitani et al. | | 2008/0104309 A1 | 5/2008 | Cheon et al. |
| 2005/0162913 A1 | 7/2005 | Chen | | 2008/0109590 A1 | 5/2008 | Jung et al. |
| 2005/0169051 A1 | 8/2005 | Khalid et al. | | 2008/0115017 A1 | 5/2008 | Jacobson |
| 2005/0189649 A1 | 9/2005 | Maruyama et al. | | 2008/0123420 A1 | 5/2008 | Brandman et al. |
| 2005/0213393 A1 | 9/2005 | Lasser | | 2008/0126686 A1 | 5/2008 | Sokolov et al. |
| 2005/0224853 A1 | 10/2005 | Ohkawa | | 2008/0130341 A1 | 6/2008 | Shalvi et al. |
| 2005/0240745 A1 | 10/2005 | Iyer et al. | | 2008/0148115 A1 | 6/2008 | Sokolov et al. |
| 2005/0243626 A1 | 11/2005 | Ronen | | 2008/0158958 A1 | 7/2008 | Sokolov et al. |
| 2006/0004952 A1 | 1/2006 | Lasser | | 2008/0181001 A1 | 7/2008 | Shalvi |
| 2006/0028875 A1 | 2/2006 | Avraham et al. | | 2008/0198650 A1 | 8/2008 | Shalvi et al. |
| 2006/0028877 A1 | 2/2006 | Meir | | 2008/0209116 A1 | 8/2008 | Caulkins |
| 2006/0101193 A1 | 5/2006 | Murin | | 2008/0209304 A1 | 8/2008 | Winarski et al. |
| 2006/0107136 A1 | 5/2006 | Gongwer et al. | | 2008/0215798 A1 | 9/2008 | Sharon et al. |
| 2006/0129750 A1 | 6/2006 | Lee et al. | | 2008/0219050 A1 | 9/2008 | Shalvi et al. |
| 2006/0133141 A1 | 6/2006 | Gorobets | | 2008/0239812 A1 | 10/2008 | Abiko et al. |
| 2006/0156189 A1 | 7/2006 | Tomlin | | 2008/0263262 A1 | 10/2008 | Sokolov et al. |
| 2006/0179334 A1 | 8/2006 | Brittain et al. | | 2008/0282106 A1 | 11/2008 | Shalvi et al. |
| 2006/0203546 A1 | 9/2006 | Lasser | | 2009/0024905 A1 | 1/2009 | Shalvi et al. |
| 2006/0218359 A1 | 9/2006 | Sanders et al. | | 2009/0043831 A1 | 2/2009 | Antonopoulos et al. |
| 2006/0221705 A1 | 10/2006 | Hemink et al. | | 2009/0043951 A1 | 2/2009 | Shalvi et al. |
| 2006/0239077 A1 | 10/2006 | Park et al. | | 2009/0049234 A1 | 2/2009 | Oh et al. |
| 2006/0256620 A1 | 11/2006 | Nguyen et al. | | 2009/0089484 A1 | 4/2009 | Chu |
| 2006/0256626 A1 | 11/2006 | Werner et al. | | 2009/0091979 A1 | 4/2009 | Shalvi |
| 2006/0256891 A1 | 11/2006 | Yuan et al. | | 2009/0094930 A1 | 4/2009 | Schwoerer |
| 2006/0271748 A1 | 11/2006 | Jain et al. | | 2009/0106485 A1 | 4/2009 | Anholt |
| 2006/0285392 A1 | 12/2006 | Incarnati et al. | | 2009/0132755 A1 | 5/2009 | Radke |
| 2006/0285396 A1 | 12/2006 | Ha | | 2009/0144600 A1 | 6/2009 | Perlmutter et al. |
| 2007/0006013 A1 | 1/2007 | Moshayedi et al. | | 2009/0150894 A1 | 6/2009 | Huang et al. |
| 2007/0019481 A1 | 1/2007 | Park | | 2009/0157964 A1 | 6/2009 | Kasorla et al. |

| | | | |
|---|---|---|---|
| 2009/0158126 A1 | 6/2009 | Perlmutter et al. | |
| 2009/0168524 A1 | 7/2009 | Golov et al. | |
| 2009/0172257 A1 | 7/2009 | Prins et al. | |
| 2009/0172261 A1 | 7/2009 | Prins et al. | |
| 2009/0204824 A1 | 8/2009 | Lin et al. | |
| 2009/0204872 A1 | 8/2009 | Yu et al. | |
| 2009/0225595 A1* | 9/2009 | Kim | 365/185.03 |
| 2009/0300227 A1 | 12/2009 | Nochimowski et al. | |
| 2009/0323412 A1 | 12/2009 | Mokhlesi et al. | |
| 2009/0327608 A1 | 12/2009 | Eschmann | |
| 2010/0017650 A1 | 1/2010 | Chin et al. | |

FOREIGN PATENT DOCUMENTS

| | | |
|---|---|---|
| EP | 1434236 B1 | 6/2004 |
| EP | 1605509 A1 | 12/2005 |
| WO | 9610256 A1 | 4/1996 |
| WO | 9828745 A1 | 7/1998 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Bez et al., "Introduction to Flash memory", Proceedings of the IEEE, vol. 91, No. 4, pp. 489-502, Apr. 2003.

Blahut, R.E., "Theory and Practice of Error Control Codes," Addison-Wesley, May 1984, section 3.2, pp. 47-48.

Chang, L., "Hybrid Solid State Disks: Combining Heterogeneous NAND Flash in Large SSDs", ASPDAC, Jan. 2008.

Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.

Databahn™, "Flash memory controller IP", Denali Software, Inc., 1994 https://www.denali.com/en/products/databahn_flash.jsp.

Datalight, Inc., "FlashFX Pro 3.1 High Performance Flash Manager for Rapid Development of Reliable Products", Nov. 16, 2006.

Duann, N., Silicon Motion Presentation "SLC & MLC Hybrid", Flash Memory Summit, Santa Clara, USA, Aug. 2008.

Eitan et al., "Can NROM, a 2-bit, Trapping Storage NVM Cell, Give a Real Challenge to Floating Gate Cells?", Proceedings of the 1999 International Conference on Solid State Devices and Materials (SSDM), pp. 522-524, Tokyo, Japan 1999.

Eitan et al., "Multilevel Flash Cells and their Trade-Offs", Proceedings of the 1996 IEEE International Electron Devices Meeting (IEDM), pp. 169-172, New York, USA 1996.

Engh et al., "A self adaptive programming method with 5 mV accuracy for multi-level storage in Flash", pp. 115-118, Proceedings of the IEEE 2002 Custom Integrated Circuits Conference, May 12-15, 2002.

Goodman et al., "On-Chip ECC for Multi-Level Random Access Memories," Proceedings of the IEEE/CAM Information Theory Workshop, Ithaca, USA, Jun. 25-29, 1989.

Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.

Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.

Horstein, "On the Design of Signals for Sequential and Nonsequential Detection Systems with Feedback," IEEE Transactions on Information Theory IT-12:4 (Oct. 1966), pp. 448-455.

Jung et al., in "A 117 mm.sup.2 3.3V Only 128 Mb Multilevel NAND Flash Memory for Mass Storage Applications," IEEE Journal of Solid State Circuits, (11:31), Nov. 1996, pp. 1575-1583.

Kawaguchi et al. 1995. A flash-memory based file system. In Proceedings of the USENIX 1995 Technical Conference, New Orleans, Louisiana. 155-164.

Kim et al., "Future Memory Technology including Emerging New Memories", Proceedings of the 24th International Conference on Microelectronics (MIEL), vol. 1, pp. 377-384, Nis, Serbia and Montenegro, May 16-19, 2004.

Lee et al., "Effects of Floating Gate Interference on NAND Flash Memory Cell Operation", IEEE Electron Device Letters, vol. 23, No. 5, pp. 264-266, May 2002.

Maayan et al., "A 512 Mb NROM Flash Data Storage Memory with 8 MB/s Data Rate", Proceedings of the 2002 IEEE International Solid-State circuits Conference (ISSCC 2002), pp. 100-101, San Francisco, USA, Feb. 3-7, 2002.

Mielke et al., "Recovery Effects in the Distributed Cycling of Flash Memories", IEEE 44th Annual International Reliability Physics Symposium, pp. 29-35, San Jose, USA, Mar. 2006.

Onfi, "Open NAND Flash Interface Specification," revision 1.0, Dec. 28, 2006.

Phison Electronics Corporation, "PS8000 Controller Specification (for SD Card)", revision 1.2, Document No. S-07018, Mar. 28, 2007.

Shalvi, et al., "Signal Codes," Proceedings of the 2003 IEEE Information Theory Workshop (ITW'2003), Paris, France, Mar. 31-Apr. 4, 2003.

Shiozaki, A., "Adaptive Type-II Hybrid Broadcast ARQ System", IEEE Transactions on Communications, vol. 44, Issue 4, pp. 420-422, Apr. 1996.

Suh et al., "A 3.3V 32Mb NAND Flash Memory with Incremental Step Pulse Programming Scheme", IEEE Journal of Solid-State Circuits, vol. 30, No. 11, pp. 1149-1156, Nov. 1995.

ST Microelectronics, "Bad Block Management in NAND Flash Memories", Application note AN-1819, Geneva, Switzerland, May 2004.

ST Microelectronics, "Wear Leveling in Single Level Cell NAND Flash Memories," Application note AN-1822 Geneva, Switzerland, Feb. 2007.

Takeuchi et al., "A Double Level $V_{TH}$ Select Gate Array Architecture for Multi-Level NAND Flash Memories", Digest of Technical Papers, 1995 Symposium on VLSI Circuits, pp. 69-70, Jun. 8-10, 1995.

Wu et al., "eNVy: A non-Volatile, Main Memory Storage System", Proceedings of the 6th International Conference on Architectural support for programming languages and operating systems, pp. 86-87, San Jose, USA, 1994.

International Application PCT/IL2007/000575 Patentability report dated Mar. 26, 2009.

International Application PCT/IL2007/000575 Search Report dated May 30, 2008.

International Application PCT/IL2007/000576 Patentability Report dated Mar. 19, 2009.
International Application PCT/IL2007/000576 Search Report dated Jul. 7, 2008.
International Application PCT/IL2007/000579 Patentability report dated Mar. 10, 2009.
International Application PCT/IL2007/000579 Search report dated Jul. 3, 2008.
International Application PCT/IL2007/000580 Patentability Report dated Mar. 10, 2009.
International Application PCT/IL2007/000580 Search Report dated Sep. 11, 2008.
International Application PCT/IL2007/000581 Patentability Report dated Mar. 26, 2009.
International Application PCT/IL2007/000581 Search Report dated Aug. 25, 2008.
International Application PCT/IL2007/001059 Patentability report dated Apr. 19, 2009.
International Application PCT/IL2007/001059 Search report dated Aug. 7, 2008.
International Application PCT/IL2007/001315 search report dated Aug. 7, 2008.
International Application PCT/IL2007/001315 Patentability Report dated May 5, 2009.
International Application PCT/IL2007/001316 Search report dated Jul. 22, 2008.
International Application PCT/IL2007/001316 Patentability Report dated May 5, 2009.
International Application PCT/IL2007/001488 Search report dated Jun. 20, 2008.
International Application PCT/IL2008/000329 Search report dated Nov. 25, 2008.
International Application PCT/IL2008/000519 Search report dated Nov. 20, 2008.
International Application PCT/IL2008/001188 Search Report dated Jan. 28, 2009.
International Application PCT/IL2008/001356 Search Report dated Feb. 3, 2009.
International Application PCT/IL2008/001446 Search report dated Feb. 20, 2009.
Sommer, N., U.S. Appl. No. 12/364,531 "Parameter Estimation Based on Error Correction Code Parity Check Equations" filed Feb. 3, 2009.
Perlmutter et al., U.S. Appl. No. 12/388,528 "Programming of Analog Memory Cells Using a Single Programming Pulse per State Transition" filed Feb. 19, 2009.
Perlmutter et al., U.S. Appl. No. 12/390,522 "Programming Analog Memory Cells for Reduced Variance After Retention" filed Feb. 23, 2009.
Perlmutter et al., U.S. Appl. No. 12/405,275 "Memory Device with Multiple-Accuracy Read Commands" filed Mar. 17, 2009.
Perlmutter et al., U.S. Appl. No. 12/397,368 "Efficient Readout from Analog Memory Cells Using Data Compression" filed Mar. 4, 2009.
Sommer, N., U.S. Appl. No. 12/171,797 "Memory Device with Non-Uniform Programming Levels" filed Jul. 11, 2008.
Shalvi et al., U.S. Appl. No. 12/251,471 "Compensation For Voltage Drifts in Analog Memory Cells" filed Oct. 15, 2008.
U.S. Appl. No. 11/949,135 Official Action dated Oct. 2, 2009.
Takeuchi et al., "A Multipage Cell Architecture for Hihg-Speed Programming Multilevel NAND Flash Memories", IEEE Journal of Solid State Circuits, vol. 33, No. 8, Aug. 1998.
US 7,161,836, 01/2007, Wan et al. (withdrawn)

* cited by examiner

MEMORY DEVICE WITH NEGATIVE THRESHOLDS

CROSS-REFERENCE TO RELATED APPLICATIONS

This application claims the benefit of U.S. Provisional Patent Application 60/886,429, filed Jan. 24, 2007, whose disclosure is incorporated herein by reference.

FIELD OF THE INVENTION

The present invention relates generally to memory devices, and particularly to methods and systems for operating analog memory cells using negative thresholds.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge. The storage value represents the information stored in the cell. In Flash memories, for example, each analog memory cell holds a certain amount of electrical charge. The range of possible analog values is typically divided into regions, each region corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells. An exemplary NAND Flash architecture is described by Takeuchi et al., in "A Double Level VTH Select Gate Array Architecture for Multi-Level NAND Flash Memories," Digest of Technical Papers, 1995 Symposium on VLSI Circuits, Jun. 8-10, 1995, pages 69-70, which is incorporated herein by reference.

In many memory devices, data is stored in programming levels that are represented by positive threshold voltages (the minimal voltage that needs to be applied to the gate of the cell in order to cause the cell to conduct), and erased cells are set to a level that is represented by a negative threshold voltage. Several methods for sensing negative threshold voltages are known in the art, such as for verifying that cells have been properly erased.

For example, U.S. Pat. No. 7,031,210, whose disclosure is incorporated herein by reference, describes a method of measuring threshold voltages in a NAND Flash memory device. A test voltage is applied to a word line of selected memory cells to measure a distribution profile of threshold voltages of memory cells. A voltage summing up a pass voltage and an operation voltage is applied to word lines of deselected cells. The operation voltage is applied to a well and a common source line. A voltage summing up a pre-charge voltage and the operation voltage is applied to a bit line. Then, a voltage variation on the bit line can be detected to measure a threshold voltage of a memory cell. A negative threshold voltage can be measured by applying a positive voltage with reference to a voltage, as the threshold voltage of the memory cell, set by subtracting the operation voltage from the test voltage in accordance with the bit line voltage variation.

U.S. Pat. No. 6,288,944, whose disclosure is incorporated herein by reference, describes a NAND-type nonvolatile memory. The memory includes a sense circuit having a constant current supply source connected to a bit line to which memory cells are connected, and a sense transistor for sensing potential at the connection point thereof. The memory further includes a first reference potential on the opposite side from the bit line of the memory cells, and a second reference potential to which the source of the sense transistor is connected. During erase verification operations, the first reference potential and the second reference potential are controlled to a predetermined positive potential. By controlling the first reference potential to the positive potential, the control gate level of a memory cell can be equivalently brought to an erase-verify level (which is negative). By further controlling the second reference potential of the sense transistor to a positive potential, the equivalent threshold voltage of the sense transistor can be increased, or the equivalent trip level of the sense inverter increased.

U.S. Pat. No. 5,696,717, whose disclosure is incorporated herein by reference, describes a memory device that includes an array of NAND strings containing a plurality of memory cells and sense amplifiers for determining whether the memory cells have been properly erased and programmed during respective erase and program verification modes of operation. The memory includes an erase voltage adjusting circuit for setting a limit on a range of acceptable erase threshold voltages and a program voltage adjusting circuit for setting a limit on a range of acceptable program threshold voltages. The sense amplifier determines, during an erase verification operation, whether a memory cell in a NAND string has been erased to have a threshold voltage within a range of acceptable erase threshold voltages. The range of acceptable erase threshold voltages typically has an upper limit less than a predetermined reference potential (e.g., ground).

SUMMARY OF THE INVENTION

Embodiments of the present invention provide a method for data storage in a memory that includes a plurality of analog memory cells, the method including:

storing data in the memory by writing first storage values to the cells;

defining one or more read reference levels for reading the cells, such that at least one of the read reference levels is negative; and after storing the data, reading second storage values from the cells using the read reference levels, so as to reconstruct the stored data.

In some embodiments, reading the second storage values includes applying respective gate voltages and source voltages to the cells and measuring source-drain currents flowing though the cells responsively to the applied source and gate voltages, and reading the second storage values using the at least one negative read reference level includes setting the gate voltages to be lower than the respective source voltages. In an embodiment, the cells are arranged in strings, and reading a second storage value from a given cell in a given string using the at least one negative read reference level includes:

applying a gate voltage to a gate of the given cell to be read, applying a source voltage that is greater than the gate voltage to a source of the string, and applying a pass voltage that is greater than the source voltage to gates of the cells other than the given cell in the given string;

pre-charging the given string to a pre-charge voltage that is greater than the source voltage; and determining the second storage value responsively to a variation in the pre-charge voltage after a predetermined time interval.

In another embodiment, writing the first storage values includes selecting the first storage values from a set of nominal storage values, at least one of which is negative. In yet another embodiment, writing the first storage values includes applying respective gate voltages and source voltages to the cells and varying the gate voltages from first gate voltages to second gate voltages so as to add electrical charges to the cells, and writing the at least one negative nominal storage value to a given cell includes setting the first and second gate voltages applied to the given cell to be lower than the source voltage applied to the given cell. In a disclosed embodiment, storing the data includes verifying the first storage values written to the cells using one or more verification reference levels, at least one of which is negative.

In some embodiments, reading the second storage values includes raising at least one voltage applied to the cells by a known amount, and determining the second storage values responsively to the known amount and to the read reference levels. In an embodiment, writing the first storage values includes selecting the first storage values from a set of positive nominal storage values, and defining the read reference levels includes defining the at least one of the read reference levels to be negative when some of the first storage values become negative.

In some embodiments, the cells include NAND Flash cells. In a disclosed embodiment, defining the read reference levels includes evaluating a condition and including the at least one negative read reference level in the one or more read reference levels responsively to the evaluated condition.

There is also provided, in accordance with an embodiment of the present invention, a method for data storage in a memory that includes a plurality of analog memory cells, the method including:

defining a set of nominal storage values, at least one of which is negative;

storing data in the memory by mapping the data to first storage values selected from the set of the nominal storage values, and writing the first storage values to the cells; and after storing the data, reading second storage values from the cells using one or more read reference levels, so as to reconstruct the stored data.

In some embodiments, writing the first storage values includes applying respective gate voltages and source voltages to the cells and varying the gate voltages from first gate voltages to second gate voltages so as to add electrical charges to the cells, and writing the at least one negative nominal storage value to a given cell includes setting the first and second gate voltages applied to the given cell to be lower than the source voltage applied to the given cell. In an embodiment, storing the data includes writing the negative at least one of the nominal storage values to some of the cells. In another embodiment, at least two of the nominal storage values are negative. In yet another embodiment, at least one of the read reference levels is negative.

In some embodiments, storing the data includes verifying the first storage values written to the cells using one or more verification reference levels, at least one of which is negative. In an embodiment, verifying the first storage values includes applying respective gate voltages and source voltages to the cells and measuring source-drain currents flowing though the cells responsively to the applied source and gate voltages, and verifying the first storage value using the at least one negative verification reference level includes setting the gate voltages to be lower than the respective source voltages.

Verifying the first storage values may include applying multiple Programming and Verification (P&V) iterations to the cells. Applying the multiple P&V iterations may include modifying parameters of a subsequent P&V iteration based on the source-drain currents measured in a previous P&V iteration. Modifying the parameters may include selecting a subset of the cells based on the source-drain currents measured in the previous P&V iteration, and applying the subsequent P&V iteration only to the selected subset.

in some embodiments, the cells include NAND Flash cells. In an embodiment, defining the nominal storage values includes evaluating a condition and including the at least one negative nominal storage value in the set of the nominal storage values responsively to the evaluated condition.

There is additionally provided, in accordance with an embodiment of the present invention, apparatus for data storage in a memory that includes a plurality of analog memory cells, the apparatus including:

programming circuitry, which is coupled to store data in the memory by writing first storage values to the cells; and reading circuitry, which is coupled to define one or more read reference levels for reading the cells, such that at least one of the read reference levels is negative, and, after the data was stored, to read second storage values from the cells using the read reference levels, so as to reconstruct the stored data.

There is further provided, in accordance with an embodiment of the present invention, apparatus for data storage in a memory that includes a plurality of analog memory cells, the apparatus including:

programming circuitry, which is coupled to define a set of nominal storage values, at least one of which is negative, and to store data in the memory by mapping the data to first storage values selected from the set of the nominal storage values and writing the first storage values to the cells; and reading circuitry, which is coupled, after the data was stored, to read second storage values from the cells using one or more read reference levels, so as to reconstruct the stored data.

There is also provided, in accordance with an embodiment of the present invention, apparatus for data storage, including:

a memory, which includes a plurality of analog memory cells;

programming circuitry, which is coupled to store data in the memory by writing first storage values to the cells; and reading circuitry, which is coupled to define one or more read reference levels for reading the cells, such that at least one of the read reference levels is negative, and, after the data was stored, to read second storage values from the cells using the read reference levels, so as to reconstruct the stored data.

There is furthermore provided, in accordance with an embodiment of the present invention, apparatus for data storage, including:

a memory, which includes a plurality of analog memory cells;

programming circuitry, which is coupled to define a set of nominal storage values, at least one of which is negative, and to store data in the memory by mapping the data to first storage values selected from the set of the nominal storage values and writing the first storage values to the cells; and reading circuitry, which is coupled, after the data was stored, to read second storage values from the cells using one or more read reference levels, so as to reconstruct the stored data.

The present invention will be more fully understood from the following detailed description of the embodiments thereof, taken together with the drawings in which:

DETAILED DESCRIPTION OF EMBODIMENTS

Overview

Some known data storage schemes use negative threshold voltages to mark erased cells. In such schemes, a block of memory cells is typically erased by setting the threshold voltages of its cells to a certain negative level. The cells may later be programmed by setting their threshold voltages to different positive levels that represent the data. Known schemes typically retrieve data from programmed cells by comparing their threshold voltages to read reference levels, whose values are non-negative.

Embodiments of the present invention that are described hereinbelow provide improved methods and systems for storing and retrieving data in analog memory cells. In some embodiments, a memory system comprises programming circuitry for storing data in the cells and reading circuitry for retrieving data from the cells. The programming circuitry programs the cells to assume multiple programming levels by writing respective nominal threshold voltages to the cells. At least one of the nominal threshold voltages is negative. In other words, one or more of the programming levels used for storing data in the cells are represented by negative threshold voltages. Such levels are referred to herein as "negative programming levels."

Programming a cell typically comprises adding charge to the cell by changing its gate voltage from a first value to a second value, so as to alter its source-drain current. Programming a cell to a negative threshold voltage typically comprises adding charge to the cell when both the first and the second values of the gate voltage are lower than the source voltage of the cell.

The cells may be programmed using a Program and Verify (P&V) process, in which the threshold voltages written to the cells are verified against suitable verification reference levels (also referred to as verification thresholds, programming thresholds or P&V thresholds). When programming cells to the negative programming levels, the programmed threshold voltages can be verified by setting the verification reference levels to negative values.

In some embodiments, the reading circuitry reads data from the cells by comparing their threshold voltages to a set of read reference levels, at least one of which is negative. Reading a cell using a negative read reference level typically comprises measuring the source-drain current of the cell when its gate voltage is lower than its source voltage. Setting a negative verification reference level can be performed in a similar manner.

Negative read reference levels may be used for reading cells that store data in negative programming levels. Alternatively or additionally, negative read reference levels are also advantageous for reading cells having positive programming levels, for example when some low positive threshold voltages drift and become negative over time.

Unlike some known methods is which a negative storage value represents only an erased status of a given memory cell, the methods and systems described herein use negative storage values for storing useful data. The techniques described herein are able to program individual cells to assume negative threshold voltages that represent useful data, and to read useful data that is represented by negative threshold voltages. In some embodiments, multiple programming levels and/or multiple reference levels are negative.

In comparison with known memory devices, devices that store data in negative programming levels may have reduced operating voltages, and therefore improved reliability, increased lifetime, lower power consumption and lower interference between cells. For a given maximum threshold voltage, exploiting the negative side of the threshold voltage axis enables increasing the storage density and/or storage reliability of the memory device.

Memory Cell Array Configuration

Figure 1:
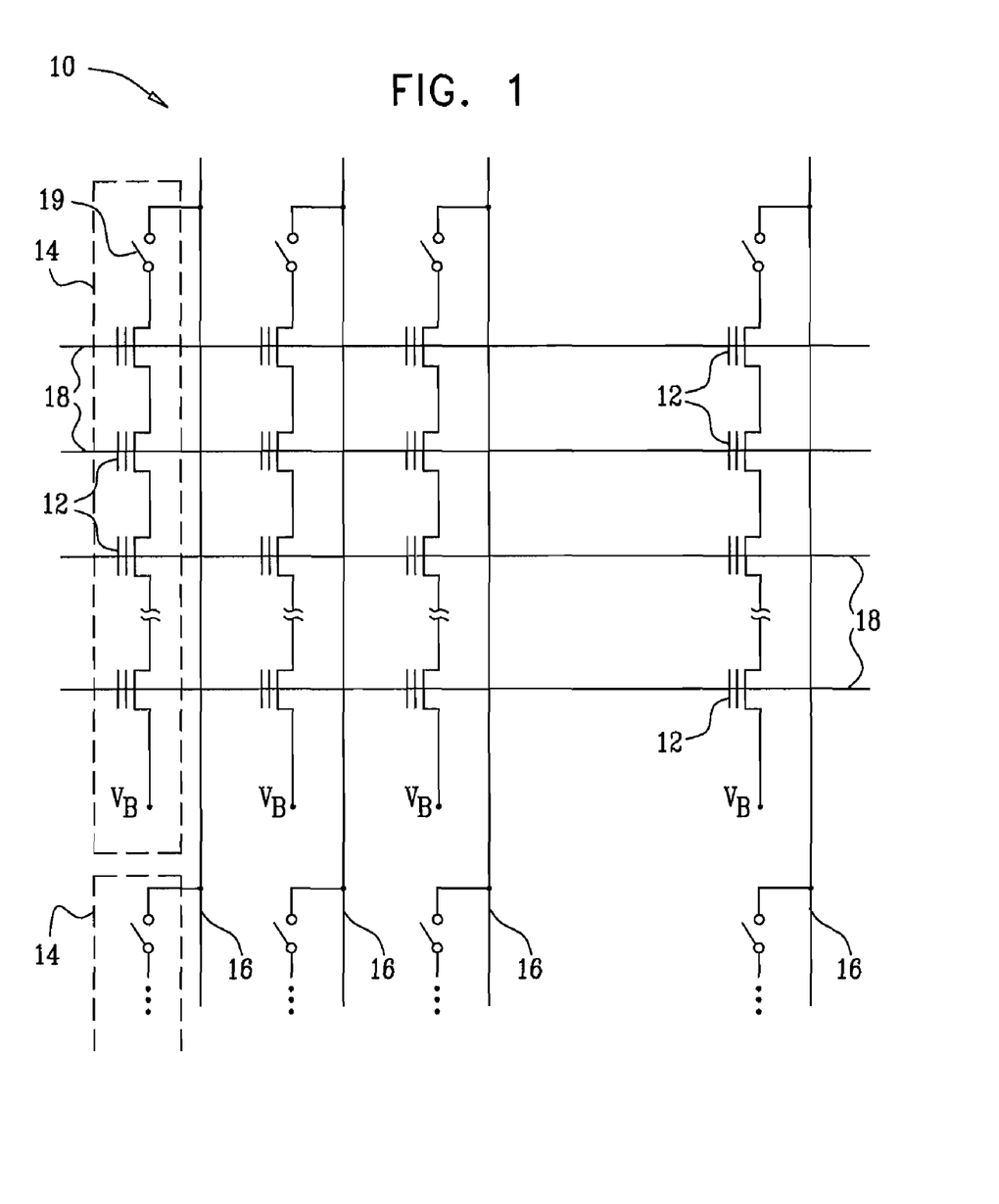
FIG. 1 is a block diagram that schematically illustrates a memory cell array, in accordance with an embodiment of the present invention.

FIG. 1 is a block diagram that schematically illustrates a memory cell array 10, in accordance with an embodiment of the present invention. In the present example, the array comprises a NAND Flash array. Array 10 comprises multiple analog memory cells 12. Each cell 12 comprises a floating gate Metal-Oxide Semiconductor (MOS) transistor. A certain amount of electrical charge (electrons or holes) can be stored in a particular cell by applying appropriate voltage levels to the transistor gate, source and drain. The value stored in the cell can be read by measuring the threshold voltage of the cell, which is defined as the minimal voltage that needs to be applied to the gate of the transistor in order to cause the transistor to conduct. The read threshold voltage is indicative of the charge stored in the cell.

Memory cells 12 of array 10 are arranged in a grid having multiple rows and columns. The gates of the transistors in each row are connected by word lines 18, and the transistors in each column are connected to bit lines 16.

The transistors in a given column are arranged in groups, which are referred to as NAND strings 14. A given NAND string can be selected (i.e., connected to the bit line) by a string select switch 19. In a given string 14, the transistors are connected source-to-drain in series with one another. The first transistor in the string is connected to the bit line via switch 19. The last transistor is connected to a certain baseline voltage $V_B$. The baseline voltage may comprise ground potential or any other suitable baseline voltage. Each NAND string typically comprises thirty-two transistors, although any other suitable NAND string size can be used.

The array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some SLC devices each row is divided into two pages, one comprising the odd-order cells and the other comprising the even-order cells. In a typical implementation, a two-bit-per-cell memory device may have four pages per row, a three-bit-per-cell memory device may have six pages per row, and a four-bit-per-cell memory device may have eight pages per row.

As will be shown below, the methods and systems described herein are able to program cells 12 to assume negative threshold voltages. As a result, data can be stored and retrieved in programming levels that are located on the negative side of the threshold voltage axis. Programming a cell to assume a negative threshold voltage typically comprises adding charge to the cell by changing its gate voltage from a first value to a second value, so as to alter its source-drain current. Both the first and the second values of the gate voltage are lower than the source voltage of the cell. The methods and systems described herein are able to read data from a cell using negative read reference levels. Reading a cell using a negative read reference level typically comprises measuring the source-drain current of the cell when its gate voltage is lower than its source voltage.

Programming the cells is sometimes performed using an iterative Program and Verify (P&V) process. In a typical P&V process, an incrementally-increasing sequence of programming pulses is applied to the cells. The cell voltages are read between successive programming iterations and verified against the desired programming levels. The process continues until the cells reach their intended programming levels or until a maximum number of iterations have been performed. In some embodiments, cells 12 can be programmed to both positive and negative threshold voltages using an iterative P&V process.

Cells 12 are typically erased in blocks that contain multiple pages. The erasure operation typically involves applying a high negative voltage to an entire erasure block simultaneously.

Array 10 may comprise several thousand erasure blocks. In a typical two-bit-per-cell MLC device, each erasure block is on the order of 32 word lines, each comprising several thousand cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used.

Some memory devices comprise two or more separate memory cell arrays, often referred to as planes. Since each plane has a certain "busy" period between successive write operations, data can be written alternately to the different planes in order to increase programming speed.

Negative Programming Levels and Negative Read Thresholds

Figure 2:
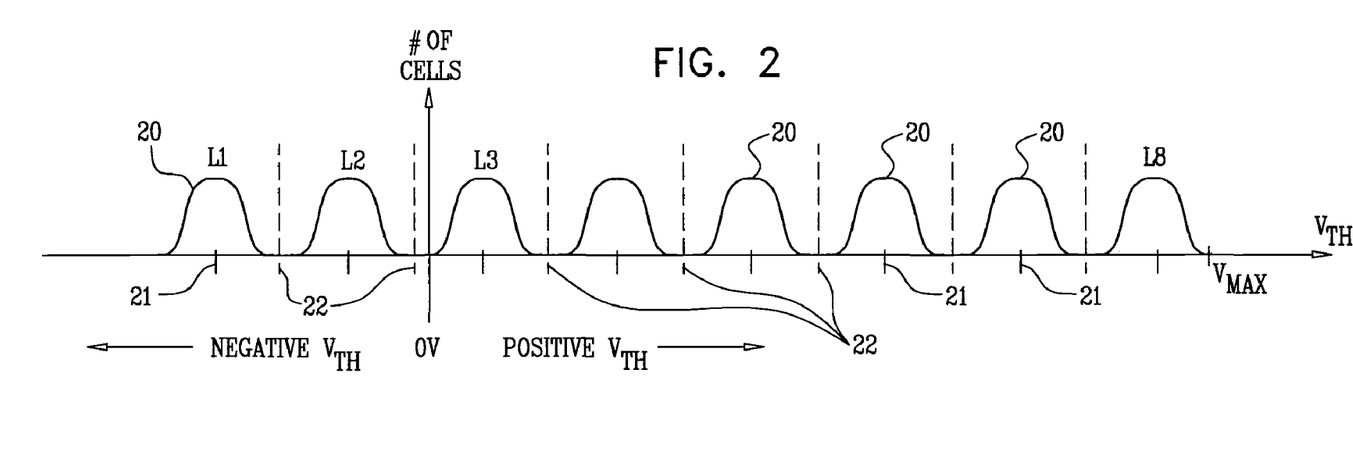
FIGS. 2 and 3 are graphs showing threshold voltage distributions in a group of analog memory cells, in accordance with embodiments of the present invention.

FIG. 2 is a graph showing threshold voltage distributions in a group of analog memory cells, in accordance with an embodiment of the present invention. The present example refers to a group of eight-level memory cells, such as a page or a block, in which each cell stores three bits of data. The figure shows eight threshold voltage distributions 20 denoted L1 . . . L8, each corresponding to a certain three-bit combination. The cells are programmed to the different levels by writing nominal threshold voltages 21 to the cells. Data is read from the memory cells by comparing their threshold voltages to a set of seven read thresholds 22.

In the example of FIG. 2, programming levels L1 and L2 are located on the negative side of the threshold voltage axis. In other words, the nominal threshold voltages corresponding to these levels are negative. In some embodiments, although not necessarily, one of the negative programming levels may be used to mark erased cells, either instead of or in addition to storing data. In the present example, two of the read thresholds that are used for reading the cells are negative.

The maximum threshold voltage used in the configuration of FIG. 2 is denoted $V_{MAX}$ in the figure. Since some of the programming levels are negative, $V_{MAX}$ can be reduced with respect to comparable eight-level schemes that store data only in positive levels. As a result of the lower $V_{MAX}$, the memory cells have improved reliability, increased lifetime, lower power consumption and lower interference between cells.

Reducing $V_{MAX}$ enables a reduction of other voltages related to the operation of the memory cells. For example, some NAND Flash devices comprise memory cells that are arranged in strings. When a certain memory cell is read, a relatively high voltage (referred to as a pass voltage $V_{PASS}$) is applied to the other cells in the string. Reducing $V_{MAX}$ enables a corresponding reduction of $V_{PASS}$.

Moreover, for a given value of $V_{MAX}$, the storage density of the memory cells can be increased by adding one or more programming levels on the negative side of the threshold voltage axis. Alternatively, moving programming levels to the negative side of the threshold voltage axis may be used to increase the separation between adjacent levels, thus reducing the likelihood of read errors and improving the reading performance.

Figure 3:
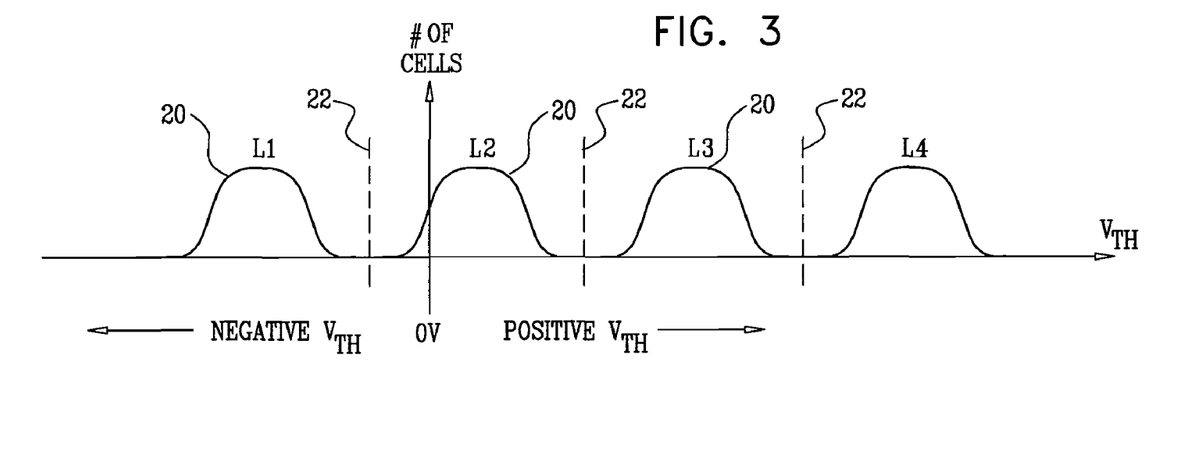

FIG. 3 is a graph showing threshold voltage distributions 20 in a group of analog memory cells, in accordance with another embodiment of the present invention. In the scheme of FIG. 3, the memory cells comprise four-level cells, each storing two data bits. The memory cells are programmed using four distributions 20 denoted L1 . . . L4. The cells are read by comparing their threshold voltages to three read thresholds 22. As can be seen in the figure, level L1 comprises a negative level, and the read threshold separating between levels L1 and L2 is negative, as well.

The feature of reading memory cells with negative read thresholds is also advantageous in conventional storage schemes in which a single negative level is used for marking erased cells. For example, the threshold voltages of cells that were originally programmed to positive levels may drift and become negative over time. These drifts may be cause, for example, by cell aging, repetitive programming and erasure of the cells, interference from other cells, and other effects.

In FIG. 3, for example, distribution L2 may have been entirely positive when the cells were first programmed, and may have drifted and/or widened to become partly negative over time. Setting the read threshold separating between levels L1 and L2 to a non-negative value (e.g., 0V) will produce poor error probability, since the optimal position of this read threshold is negative. Setting the read threshold to the optimal negative value is important for maintaining adequate error performance. Thus, the ability to set negative read thresholds improves the reading performance of conventional memory cells, as well. The ability to use negative read thresholds enables tracking the optimal threshold positions along the entire life cycle of the memory cells.

The methods and systems described herein can be used for storing data in any suitable number of negative programming levels, and/or using any suitable number of negative read thresholds and verification thresholds.

System Description

Figure 4:
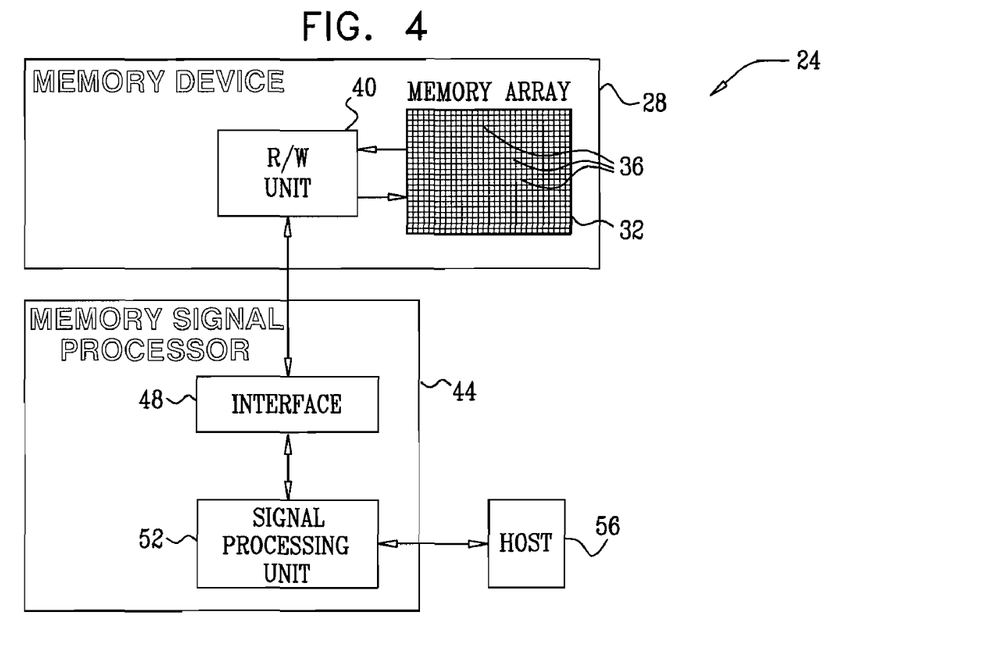
FIG. 4 is a block diagram that schematically illustrates a memory system, in accordance with an embodiment of the present invention.

FIG. 4 is a block diagram that schematically illustrates a memory system 24, in accordance with an embodiment of the present invention. System 24 stores data using negative programming levels and/or negative thresholds, using the techniques described herein. System 24 can be used in various host systems and devices, such as in computing devices, cellular phones or other communication terminals, removable memory modules ("disk-on-key" devices), digital cameras, music and other media players and/or any other system or device in which data is stored and retrieved.

System 24 comprises a memory device 28, which stores data in a memory cell array 32. The memory array comprises multiple analog memory cells 36. In the context of the present patent application and in the claims, the term "analog memory cell" is used to describe any memory cell that holds a continuous, analog value of a physical parameter, such as an electrical voltage or charge. Array 32 may comprise analog memory cells of any kind, such as, for example, NAND and NOR Flash cells, or any other suitable type of cells. In some embodiments, array 32 is an array of NAND Flash cells that are arranged in strings, such as in the configuration of FIG. 1 above.

The charge levels stored in the cells and/or the analog voltages or currents written into and read out of the cells are referred to herein collectively as analog values or storage values. Although the embodiments described herein mainly address threshold voltages, the methods and systems described herein may be used with any other suitable kind of storage values.

System 24 stores data in the analog memory cells by programming the cells to assume respective memory states, also referred to as programming levels. The memory states are selected from a finite set of possible states, and each state corresponds to a certain nominal storage value. For example, a 2 bit/cell MLC can be programmed to assume one of four possible memory states by writing one of four possible nominal storage values into the cell.

Memory device 28 comprises a reading/writing (R/W) unit 40, which converts data for storage in the memory device to analog storage values and writes them into memory cells 36. In alternative embodiments, the R/W unit does not perform the conversion, but is provided with voltage samples, i.e., with the storage values for storage in the cells. When reading data out of array 32, R/W unit 40 converts the storage values of memory cells 36 into digital samples having a resolution of one or more bits.

The storage and retrieval of data in and out of memory device 28 is performed by a Memory Signal Processor (MSP) 44. MSP 44 comprises an interface 48 for communicating with memory device 28, and a signal processing unit 52, which processes the data that is written into and read from device 28. In some embodiments, unit 52 produces the storage values for storing in the memory cells and provides these values to R/W unit 40. Alternatively, unit 52 provides the data for storage, and the conversion to storage values is carried out by the R/W unit internally to the memory device.

MSP 44 communicates with a host 56, for accepting data for storage in the memory device and for outputting data retrieved from the memory device. MSP 44, and in particular unit 52, may be implemented in hardware. Alternatively, MSP 44 may comprise a microprocessor that runs suitable software, or a combination of hardware and software elements.

The configuration of FIG. 4 is an exemplary system configuration, which is shown purely for the sake of conceptual clarity. Any other suitable configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 4, memory device 28 and MSP 44 are implemented as two separate Integrated Circuits (ICs). In alternative embodiments, however, the memory device and MSP may be integrated on separate semiconductor dies in a single Multi-Chip Package (MCP) or System on Chip (SoC). Further alternatively, some or all of the MSP circuitry may reside on the same die on which the memory array is disposed. Further alternatively, some or all of the functionality of MSP 44 can be implemented in software and carried out by a processor or other element of the host system. In some implementations, a single MSP 44 may be connected to multiple memory devices 28.

Data Storage and Retrieval Using Negative Programming Levels and/or Thresholds As noted above, system 24 comprises programming circuitry that converts the data intended for storage into storage values, and writes the storage values to the memory cells. The programming circuitry may reside in the MSP, in the R/W unit of the memory device, or it may be partitioned between the two devices. In some embodiments, the programming circuitry writes the storage values into the cells in an iterative Program and Verify (P&V) process, as in known in the art.

In a typical P&V process, the programming circuitry applies an incrementally-increasing sequence of programming pulses to the cells, and verifies the programmed storage values between iterations by comparing them to one or more verification thresholds (also referred to herein as verification reference levels). Similarly, the reading circuitry reads the storage values of the cells by comparing them to one or more read thresholds (also referred to herein as read reference levels), and thus associates each cell with a certain programming level. The reading circuitry may reside in R/W unit 40 or jointly in the R/W unit and the MSP.

In some embodiments, the programming circuitry of system 24 applies a P&V process that programs the cells to both positive and negative threshold voltages, as derived from the data intended for storage. Programming a negative threshold voltage typically comprises adding charge to the cell by changing its gate voltage from a first value to a second value, so as to alter its source-drain current. Both the first and the second values of the gate voltage are lower than the source voltage of the cell. Programming a positive threshold voltage typically comprises adding charge to the cell when the gate voltage is higher than the source voltage of the cell. The programming circuitry applies the appropriate voltages to the cells in order to perform the desired operations.

As noted above, verifying the stored values comprises measuring the source-drain currents of the cells and comparing them with verification reference levels. In some embodiments, the programming circuitry determines parameters of a subsequent P&V iteration based on the source-drain currents measured in a previous iteration. For example, the programming circuitry may determine which of the cells have reached their intended target levels in the previous iteration, and continue to apply subsequent iterations only to the cells that have not yet reached their target levels.

In some embodiments, system 24 uses at least one negative read threshold for reading data from the memory cells. The reading circuitry may use any suitable method for setting negative read thresholds and for measuring negative threshold voltages. Typically, reading the storage value of a cell comprises measuring the current that flows between the source and drain of the cell. Reading a negative storage value from a cell thus comprises measuring the source-drain current of the cell when its gate voltage is lower than its source voltage. Typically, the R/W unit is able to read both positive and negative storage values, i.e., to measure the source-drain current both when the gate voltage is lower than the source voltage and when the gate voltage is higher than the source voltage. The reading circuitry applies the appropriate voltages to the cells in order to perform the desired operations.

Typically but not necessarily, setting a negative read threshold involves raising one or more of the voltages applied to the memory cell being read by a known amount, and determining the storage value stored in the cell based on the known amount and on the read thresholds. For example, the reading circuitry may raise the word line and bit line voltages of the array by a certain operation voltage in order to be able to measure negative threshold voltages.

In particular, when the memory comprises a NAND Flash memory whose cells are arranged in NAND string, the reading circuitry may read a cell whose threshold voltage is negative by:

(1) Applying a gate voltage $V_g$ to the gate (word line) of the cell to be read, applying a pass voltage $V_{pass}$ to the other gates (word lines) in the string, and applying a source voltage $V_s$ to the source of the NAND string, such that $V_s > V_g$ and $V_{pass} > V_s$.

(2) Pre-charging the bit line that is connected to the NAND string in question to a voltage $V_{bl}$, $V_{bl} > V_s$.

(3) Measuring the variation in the bit line voltage after a predetermined time interval.

Alternatively, the reading circuitry may set the word line voltages to zero, and raise the array potential to a certain positive potential. Further alternatively, the reading circuitry may apply any other suitable method for setting negative read thresholds and for comparing the storage values of the cells with the negative thresholds.

In some embodiments, systems 20 programs the cells so that at least one programming level that is used for storing data comprises a negative programming level. In other words, at least one programming level that is used for storing data corresponds to a negative nominal storage value. The programming circuitry may verify the negative storage values written to the cells by reading the storage values and comparing them with one or more verification thresholds, whose values are negative.

The verification operation is typically similar to the reading operation, except for using a different set of thresholds. Any of the above-mentioned techniques for reading negative threshold voltages can also be used for verification. In some embodiments, some hardware may be shared between the programming and reading circuitry.

Figure 5:
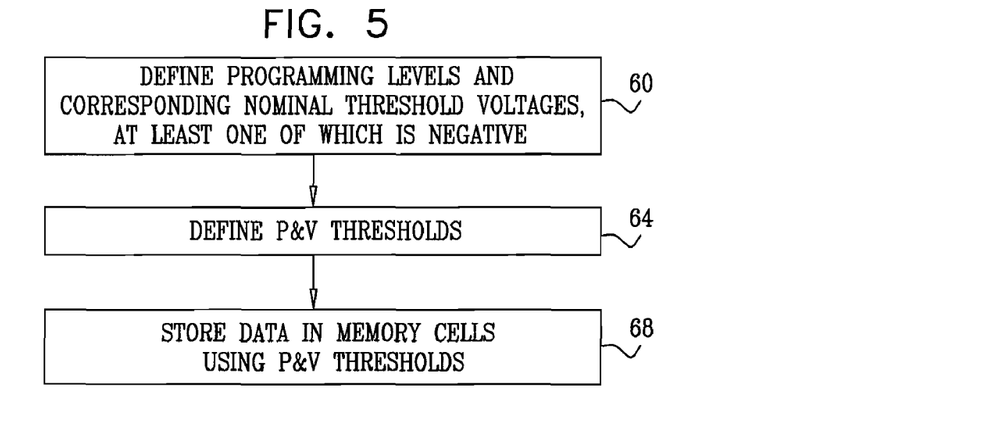
FIG. 5 is a flow chart that schematically illustrates a method for programming analog memory cells, in accordance with an embodiment of the present invention.

FIG. 5 is a flow chart that schematically illustrates a method for programming analog memory cells, in accordance with an embodiment of the present invention. The data for storage is typically accepted from host 56. The method begins with the MSP defining a set of programming levels and an associated set of nominal storage values, at a level definition step 60. At least one of the nominal storage values in the set is negative.

The MSP defines a set of verification thresholds for verifying the storage values that correspond to the different programming levels, at a programming threshold definition step 64. Typically, the verification threshold that corresponds to a negative programming level is negative.

The programming circuitry stores data in the memory cells by programming the cells using the defined nominal storage values, at a programming step 68. As part of the programming process, the programming circuitry verifies the programmed storage values using the defined verification thresholds.

Figure 6:
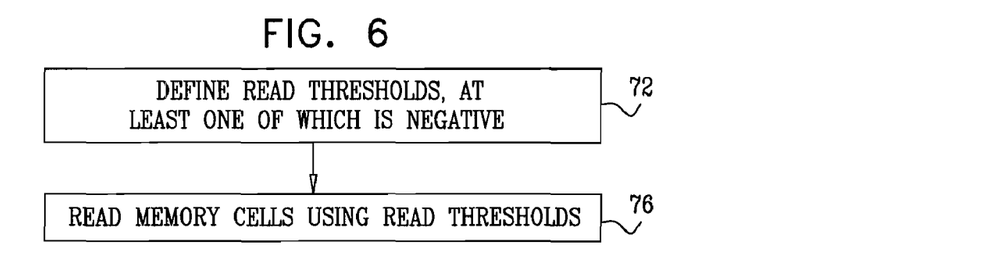
FIG. 6 is a flow chart that schematically illustrates a method for reading analog memory cells, in accordance with an embodiment of the present invention.

FIG. 6 is a flow chart that schematically illustrates a method for reading analog memory cells, in accordance with an embodiment of the present invention. The method begins with the MSP defining a set of read thresholds, at a read threshold definition step 72. At least one of the read thresholds defined at step 72 is negative. The reading circuitry reads the memory cells using the defined read thresholds, at a reading step 76, so as to reconstruct the data. The MSP outputs the reconstructed data to the host.

In some cases, operations involving negative reference levels and/or negative programming levels may be less efficient than operations that involve only non-negative programming levels and reference levels, and therefore it may be advantageous to revert to negative voltage operation only when needed. In some embodiments, the MSP determines whether or not to use negative reference levels and/or negative programming levels during operations. The MSP may evaluate various types of conditions in order to determine whether or not it is preferable to use negative reference levels and/or negative programming levels.

For example, the MSP may decide to apply a negative reference level upon determining that a large number of cells in a given page have a negative threshold voltage, such as due to programming failures, temperature shift, leakage currents or for any other reason. The MSP may assess the number of cells in the page whose threshold voltage is negative by reading the cells with a read reference level set to zero, and counting the number of cells whose threshold voltage is below the reference level. In some embodiments, when the page is programmed, the MSP may store the number of programmed cells. The MSP may compare the number of cells having a negative threshold voltage with the number of programmed cells, in order to determine whether or not to read the page using a negative reference level.

As another example, the MSP may determine whether or not to employ a negative programming level when programming a page. The MSP may estimate the expected likelihood of errors, e.g., the distortion level or expected error probability in the page, if the page were to be programmed with only positive programming levels. The estimation may be based, for example, on the number of previous programming and erasure operations. If the likelihood of errors is relatively low, the MSP will use only positive programming levels. When the likelihood of errors is high, the MSP may program the page using programming levels, one or more of which is negative.

Although the embodiments described herein mainly address writing and reading data in solid-state memory devices, the principles of the present invention can also be used for programming and reading other types of storage devices, such as Hard Disk Drives (HDD).

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for data storage in a memory that includes a plurality of analog memory cells, the method comprising:
storing data in the memory by writing first storage values to the cells;
defining one or more read reference levels for reading the cells, such that at least one of the read reference levels is negative; and
after storing the data, reading second storage values from the cells using the read reference levels, so as to output the stored data,
wherein reading the second storage values comprises applying respective gate voltages and source voltages to the cells and measuring source-drain currents flowing though the cells responsively to the applied source and gate voltages, and wherein reading the second storage values using the at least one negative read reference level comprises setting the gate voltages to be lower than the respective source voltages.

2. The method according to claim 1, wherein the cells are arranged in strings, and wherein reading a second storage value from a given cell in a given string using the at least one negative read reference level comprises:
applying a gate voltage to a gate of the given cell to be read, applying a source voltage that is greater than the gate voltage to a source of the string, and applying a pass voltage that is greater than the source voltage to gates of the cells other than the given cell in the given string;
pre-charging the given string to a pre-charge voltage that is greater than the source voltage; and
determining the second storage value responsively to a variation in the pre-charge voltage after a predetermined time interval.

3. The method according to claim 1, wherein writing the first storage values comprises selecting the first storage values from a set of nominal storage values, at least one of which is negative.

4. The method according to claim 3, wherein writing the first storage values comprises applying respective gate voltages and source voltages to the cells and varying the gate voltages from first gate voltages to second gate voltages so as to add electrical charges to the cells, and wherein writing the at least one negative nominal storage value to a given cell comprises setting the first and second gate voltages applied to the given cell to be lower than the source voltage applied to the given cell.

5. The method according to claim 1, wherein storing the data comprises verifying the first storage values written to the cells using one or more verification reference levels, at least one of which is negative.

6. The method according to claim 1, wherein reading the second storage values comprises raising at least one voltage applied to the cells by a known amount, and determining the second storage values responsively to the known amount and to the read reference levels.

7. The method according to claim 1, wherein writing the first storage values comprises selecting the first storage values from a set of positive nominal storage values, and wherein defining the read reference levels comprises defining the at least one of the read reference levels to be negative when some of the first storage values become negative.

8. The method according to claim 1, wherein the cells comprise NAND Flash cells.

9. The method according to claim 1, wherein defining the read reference levels comprises evaluating a condition and including the at least one negative read reference level in the one or more read reference levels responsively to the evaluated condition.

10. Apparatus for data storage in a memory that includes a plurality of analog memory cells, the apparatus comprising:
programming circuitry, which is coupled to store data in the memory by writing first storage values to the cells; and
reading circuitry, which is coupled to define one or more read reference levels for reading the cells, such that at least one of the read reference levels is negative, and, after the data was stored, to read second storage values from the cells using the read reference levels, so as to output the stored data,
wherein the reading circuitry is coupled to read the second storage values by applying respective gate voltages and source voltages to the cells and measuring source-drain currents flowing though the cells responsively to the applied source and gate voltages, and to set the gate voltages to be lower than the respective source voltages so as to read the second storage values using the at least one negative read reference level.

11. The apparatus according to claim 10, wherein the cells are arranged in strings, and wherein the reading circuitry is coupled to read a second storage value from a given cell in a given string using the at least one negative read reference level by:
applying a gate voltage to a gate of the given cell to be read, applying a source voltage that is greater than the gate voltage to a source of the string, and applying a pass voltage that is greater than the source voltage to gates of the cells other than the given cell in the given string;
pre-charging the given string to a pre-charge voltage that is greater than the source voltage; and
determining the second storage value responsively to a variation in the pre-charge voltage after a predetermined time interval.

12. The apparatus according to claim 10, wherein the programming circuitry is coupled to select the first storage values from a set of nominal storage values, at least one of which is negative.

13. The apparatus according to claim 12, wherein the programming circuitry is coupled to write the first storage values by applying respective gate voltages and source voltages to the cells and varying the gate voltages from first gate voltages to second gate voltages so as to add electrical charges to the cells, and to set the first and second gate voltages applied to a given cell to be lower than the source voltage applied to the given cell so as to write the at least one negative nominal storage value to the given cell.

14. The apparatus according to claim 10, wherein the programming circuitry is coupled to verify the first storage values written to the cells using one or more verification reference levels, at least one of which is negative.

15. The apparatus according to claim 10, wherein the reading circuitry is coupled to raise at least one voltage applied to the cells by a known amount, and to determine the second storage values responsively to the known amount and to the read reference levels.

16. The apparatus according to claim 10, wherein the programming circuitry is coupled to select the first storage values from a set of positive nominal storage values, and wherein the reading circuitry is coupled to define the at least one of the read reference levels to be negative when some of the first storage values become negative.

17. The apparatus according to claim 10, wherein the cells comprise NAND Flash cells.

18. The apparatus according to claim 10, wherein the reading circuitry is coupled to evaluate a condition and to include the at least one negative read reference level in the one or more read reference levels responsively to the evaluated condition.

19. Apparatus for data storage, comprising:
- a memory, which comprises a plurality of analog memory cells;
- programming circuitry, which is coupled to store data in the memory by writing first storage values to the cells; and
- reading circuitry, which is coupled to define one or more read reference levels for reading the cells, such that at least one of the read reference levels is negative, and, after the data was stored, to read second storage values from the cells using the read reference levels, so as to output the stored data, wherein the reading circuitry is coupled the second storage values by applying respective gate voltages and source voltages to the cells and measuring source-drain currents flowing though the cells responsively to the applied source and gate voltages, and to set the gate voltages to be lower than the respective source voltages so as to read the second storage values using the at least one negative read reference level.

* * * * *